(12) United States Patent
Lai

(10) Patent No.: US 7,811,843 B1
(45) Date of Patent: Oct. 12, 2010

(54) METHOD OF MANUFACTURING LIGHT-EMITTING DIODE

(75) Inventor: Chih-Chen Lai, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/686,511

(22) Filed: Jan. 13, 2010

(51) Int. Cl.
*H01L 21/00* (2006.01)

(52) U.S. Cl. .................... 438/28; 438/26; 438/119; 257/E21.502

(58) Field of Classification Search ............ 438/28, 438/26, 119, 118, 106, 107, 110
See application file for complete search history.

(56) References Cited

U.S. PATENT DOCUMENTS

2010/0022039 A1* 1/2010 Chang .................... 438/28

* cited by examiner

*Primary Examiner*—Charles D Garber
*Assistant Examiner*—Reema Patel
(74) *Attorney, Agent, or Firm*—Raymond J. Chew

(57) ABSTRACT

A method of manufacturing an LED includes the following steps: preparing an LED wafer including a substrate and an epitaxial layer formed on the substrate; cutting the epitaxial layer of the LED wafer into a plurality of LED dies with a gap defined between every two neighboring dies; filling an electrically insulating material in each gap between neighboring LED dies such that the neighboring LED dies are separated from each other by the insulating material; providing a circuit board having a layer of anisotropic conductive adhesive coated thereon; pressing the LED dies against the adhesive to bring the top surfaces of the LED dies into contact with the adhesive such that the LED dies each are electrically connected to the circuit board via the adhesive; and encapsulating the LED dies with a light penetrable material.

9 Claims, 10 Drawing Sheets

METHOD OF MANUFACTURING LIGHT-EMITTING DIODE

BACKGROUND

1. Technical Field

The present disclosure relates to LEDs (light emitting diodes), and particularly to a method of manufacturing an LED.

2. Description of Related Art

Presently, LEDs are preferred for use in non-emissive display devices than CCFLs (cold cathode fluorescent lamp) due to their high brightness, long lifespan, and wide color range.

In manufacturing an LED, most of the methods involve the following steps. Firstly, an LED wafer is provided and the LED wafer is cut into a plurality of individual LED dies. The LED dies are then disposed on a circuit board one by one, and each of the LED dies is independently encapsulated to form an LED. However, such method has a low manufacturing efficiency and is unfavorable to realize automatic manufacturing. Therefore, such method generally involves a relatively high manufacturing cost.

Therefore, a new method of manufacturing an LED is desired to overcome the above described shortcoming.

DETAILED DESCRIPTION

Figure 1:
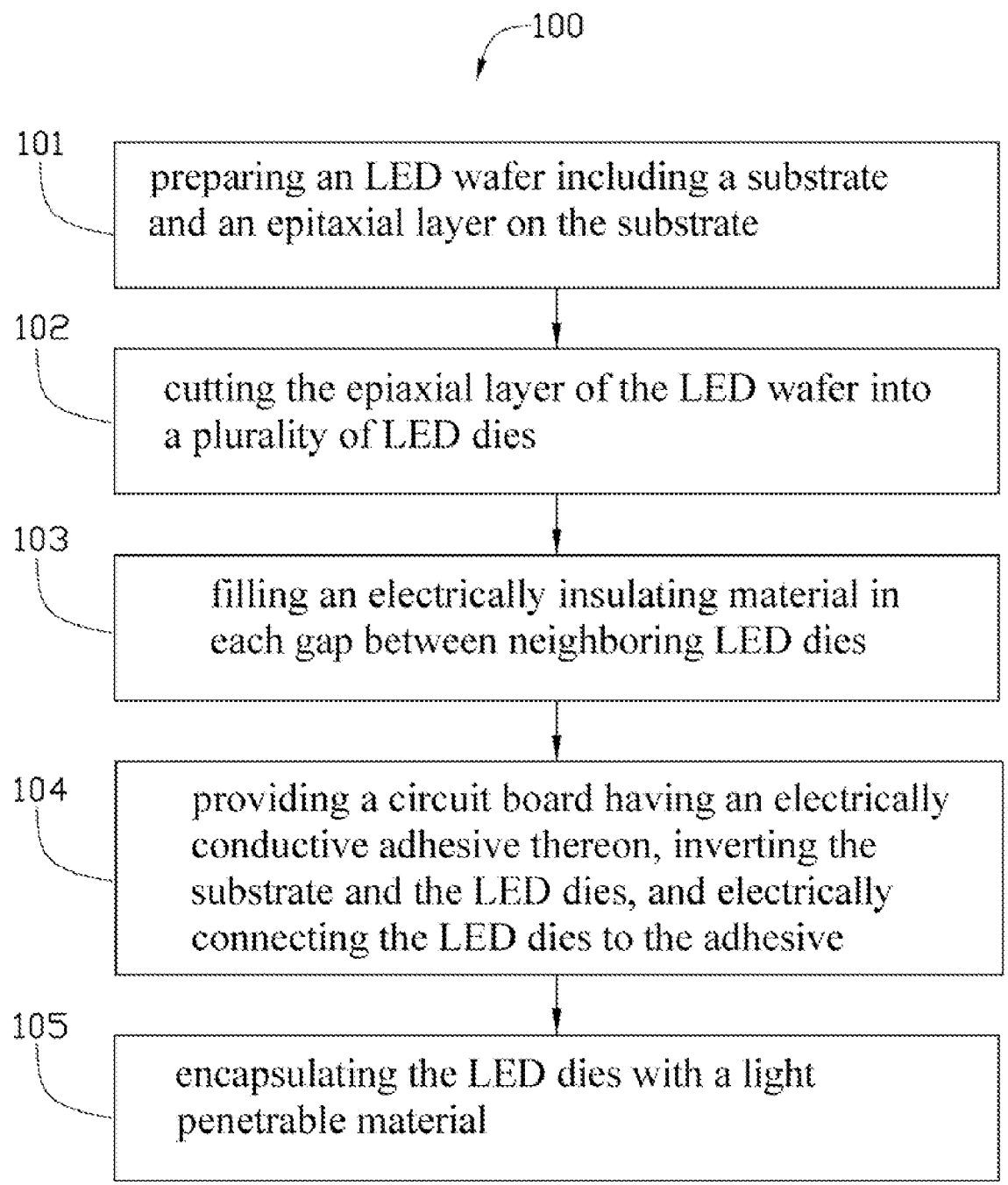
FIG. 1 is a flow chart showing a method of manufacturing an LED in accordance with an embodiment of the present disclosure.

FIG. 1 shows a method 100 of manufacturing an LED in accordance with an embodiment of the present disclosure. The method includes steps 101, 102, 103, 104, 105, which will be disclosed in detail herebelow.

Figure 2:
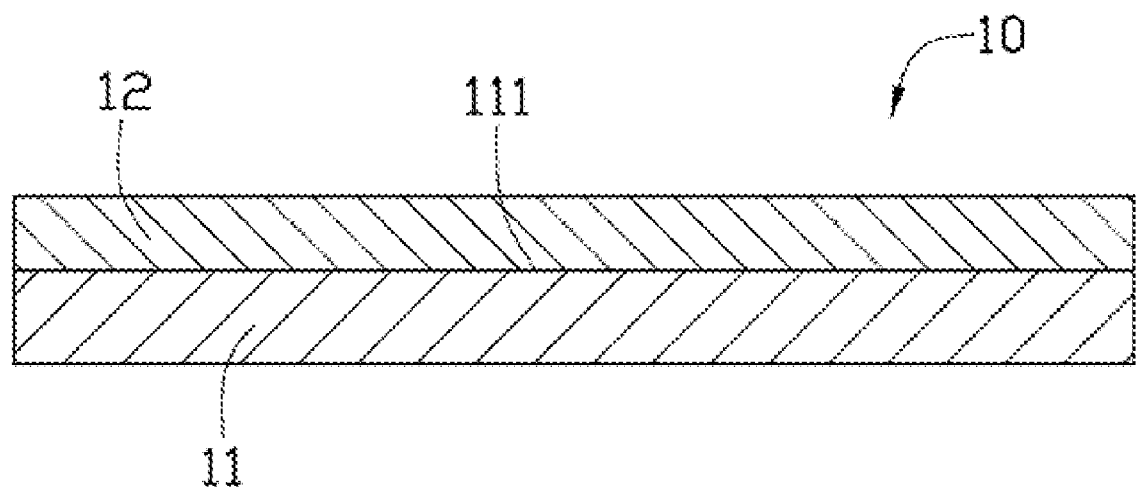
FIG. 2 shows an LED wafer provided according to a first step of the method.

Referring to FIG. 1 and FIG. 2, in the step 101, an LED wafer 10 is prepared, wherein the LED wafer 10 includes a substrate 11 and an epitaxial layer 12 formed on the substrate 11. The substrate 11 may be a sapphire substrate. The epitaxial layer 12 is formed on a top surface 111 of the substrate 11. The epitaxial layer 12 forms as a p-n junction type semiconductor light-emitting structure. The p-n junction type semiconductor light-emitting structure may be gallium nitride-based III-V group compound semiconductor.

Figure 3:
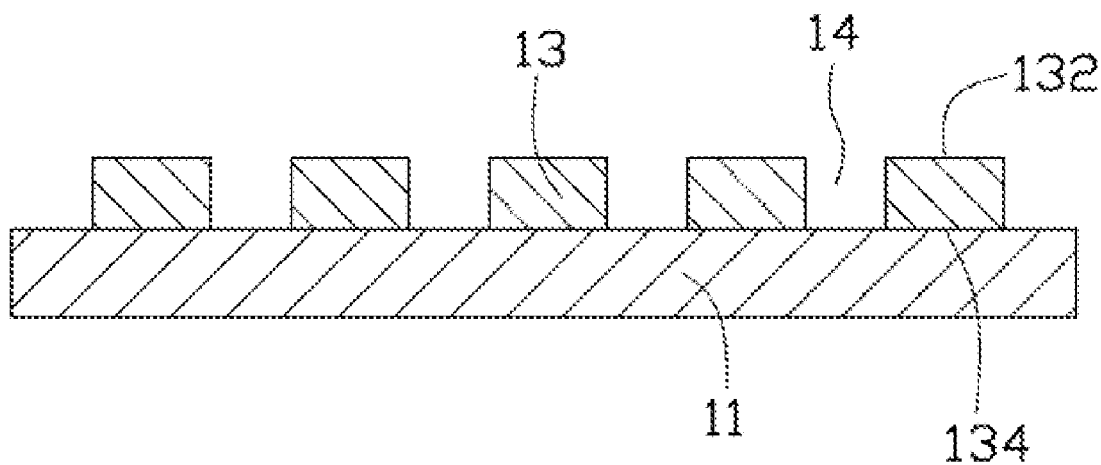
FIG. 3 shows an epitaxial layer of the LED wafer of FIG. 2 being cut into a plurality of individual LED dies according to a second step of the method.

Referring to FIG. 1 and FIG. 3, in the step 102, the epitaxial layer 12 of the LED wafer 10 is cut into a plurality of LED dies 13. The LED dies 13 are arranged in rows and columns on the substrate 11. The LED dies 13 are separated from each other with a gap 14 defined between two neighboring LED dies 13. Each of the LED dies 13 includes a top surface 132 and an opposite bottom surface 134. The bottom surfaces 134 of the LED dies 13 are attached to the top surface 111 of the substrate 11. The top surface 132 has a reflection metal layer made of, for example, aluminum, for reflecting light generated by an active layer of the LED die 132 to radiate through the bottom surface 134.

Figure 4:
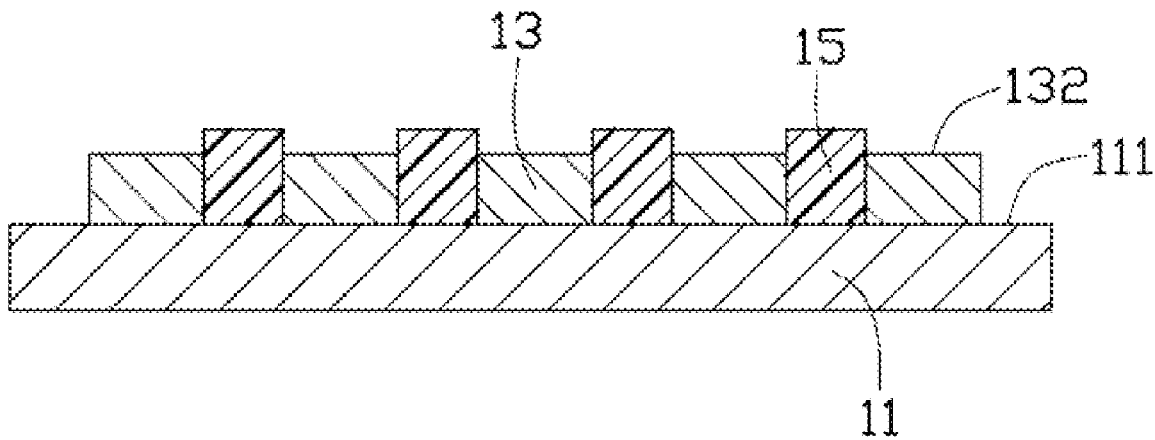
FIG. 4 shows an insulating material being filled into a gap between every two neighboring LED dies of FIG. 3 according to a third step of the method.
Figure 5:
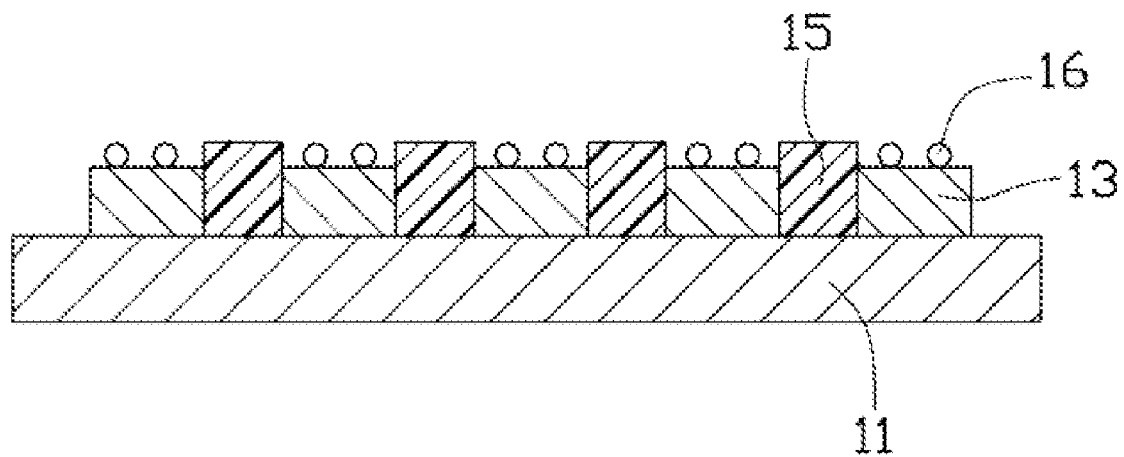
FIG. 5 is similar to FIG. 4, but with two tin balls formed on each LED die.

Referring to FIG. 1 and FIG. 4, in the step 103, an electrically insulating material 15 is filled in each gap 14 defined between neighboring LED dies 13. The insulating material 15 may be formed by a photoresist. The neighboring LED dies 13 are separated from each other by the insulating material 15. The insulating material 15 has a height greater than a height of each of the LED dies 13 such that a top surface of the insulating material 15 is located above the top surface 132 of each of the LED dies 13. As shown in FIG. 5, two tin balls 16 are formed on the top surface 132 of each of the LED dies 13. The two tin balls 16 are electrically connected to positive and negative electrodes of each LED die 13.

Figure 6:
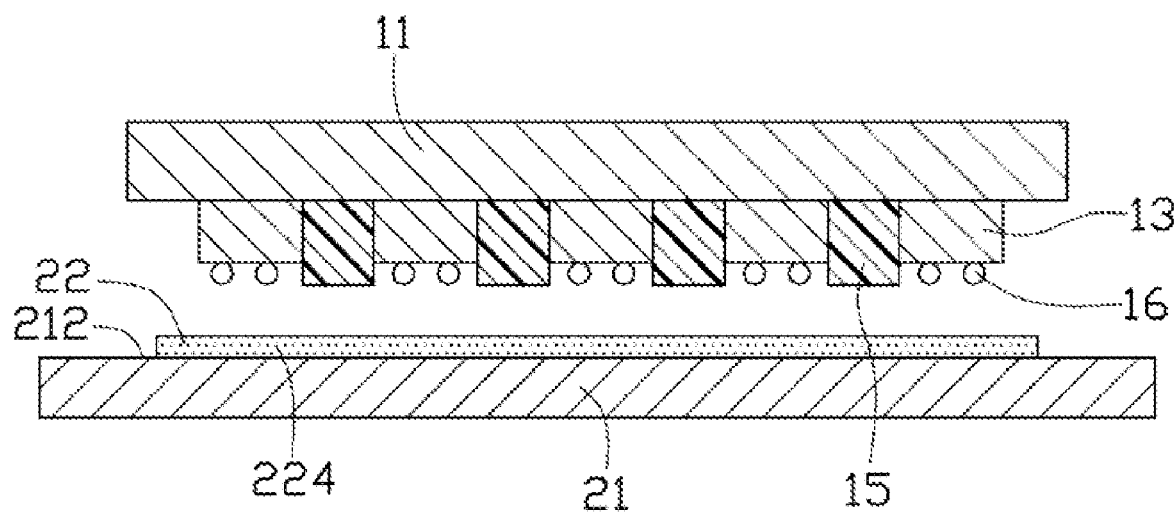
FIGS. 6-7 show the LED dies of FIG. 5 being assembled to a circuit board according to a fourth step of the method.
Figure 7:
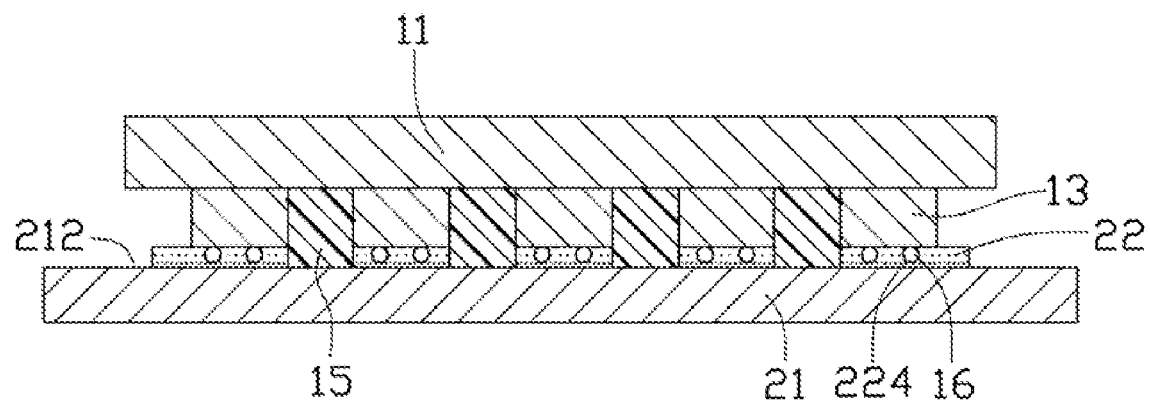

Referring to FIG. 1 and FIGS. 6-7, in the step 104, a circuit board 21 having a layer of electrically conductive adhesive 22 thereon is provided. The adhesive 22 is coated on a top surface 212 of the circuit board 21. The adhesive 22 may be an anisotropic conductive adhesive. Electrically conductive particles 224 are dispersed in the adhesive 22. Then, the substrate 11 and the LED dies 13 are inverted and pressed against the adhesive 22 to bring the top surfaces 132 of the LED dies 13 into contact with the adhesive 22, and a top of each insulating material 15 is inserted into the adhesive 22 and abuts against the top surface 212 of the circuit board 21. Thus, the LED dies 13 each are electrically connected to the circuit board 21 via the two tin balls 224 electrically connecting with some of the electrically conductive particles 224 of the adhesive 22 which are pressed by the two tin balls 224 and electrically connected with the circuit board 21. Such electrical connection between the LED dies 13 and the circuit board 21 is known by the art as ACF bonding (anisotropic conductive film bonding). Due to the presence of the insulating material 15 in each gap 14 between the LED dies 13, the adhesive 22 is prevented from flowing into the gap 14 between the LED dies 13, thereby avoiding a possible short circuit caused by the particles 224 in the adhesive 22 flowing into the gap 14 if no insulating material 15 is presented in the gap 14. In the present method, every two neighboring LED dies 13 are separated and electrically insulated from each other by the insulating material 15 disposed in the gap 14 between the LED dies 13.

Figure 8A:
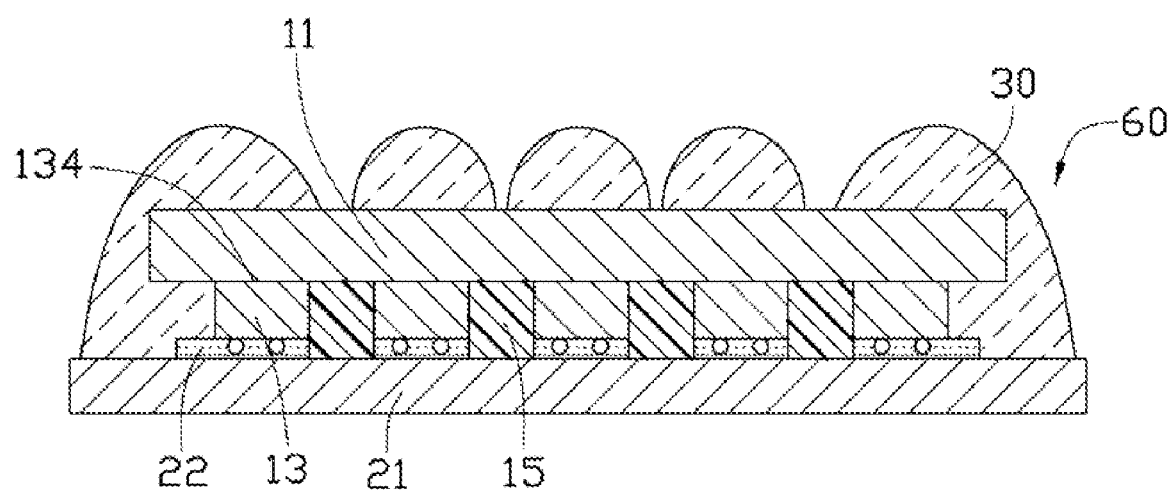
FIG. 8a shows the LED dies of FIG. 7 being individually encapsulated according to a fifth step of the method.
Figure 8B:
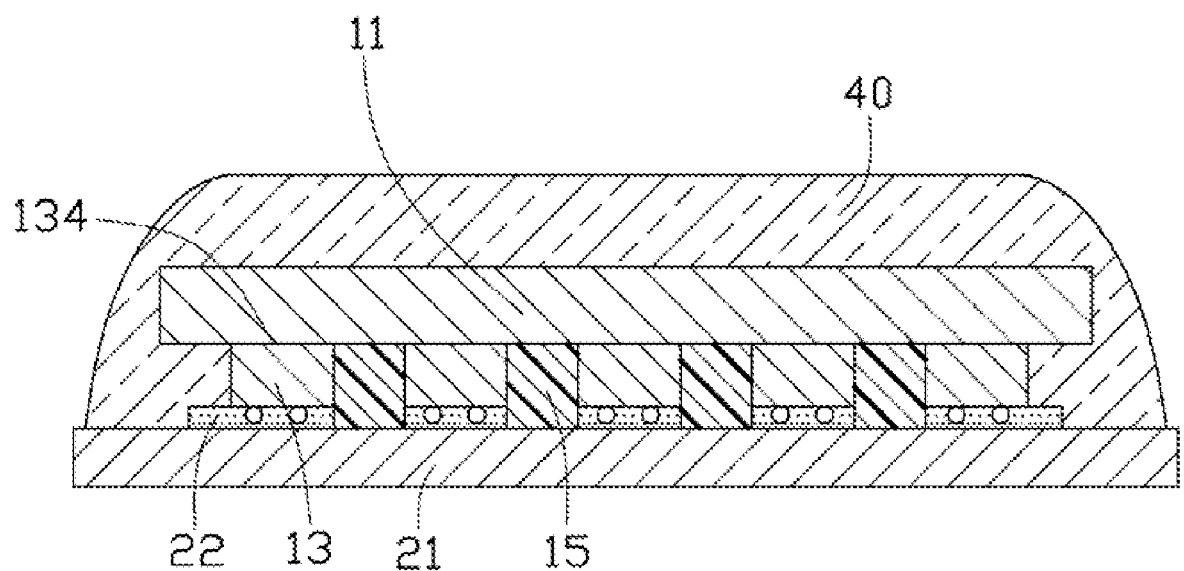
FIG. 8b shows the LED dies of FIG. 7 being integrally encapsulated according to an alternative of the fifth step of the method.
Figure 8C:
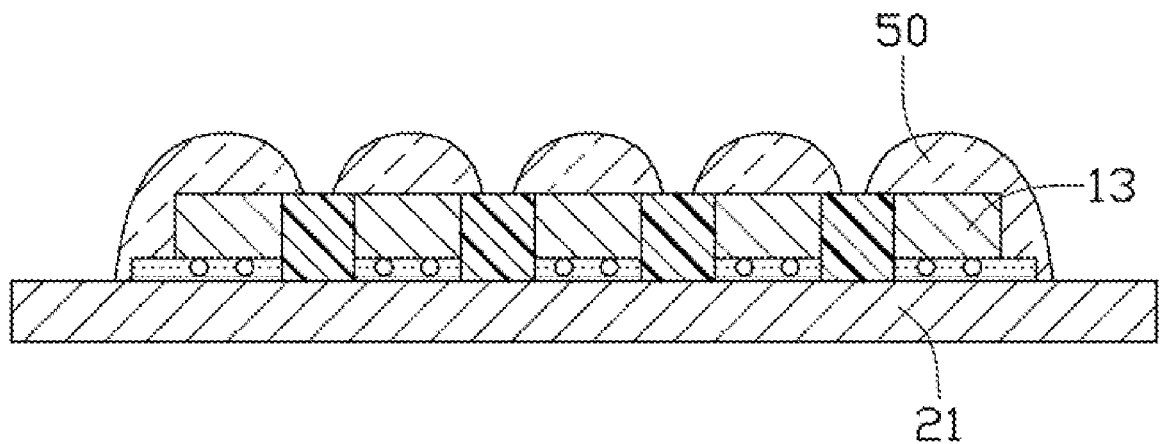
FIG. 8c shows the LED dies of FIG. 7 being individually encapsulated after a substrate of LED dies is removed according to a further alternative of the fifth step of the method.

Referring to FIG. 1 and FIGS. 8a-8c, in the step 105, the LED dies 13 are encapsulated to obtain the LEDs. Particularly, as shown in FIG. 8a, the LED dies 13 are individually encapsulated by a light penetrable material 30 one by one such that the LED dies 13 after encapsulated can be cut into a plurality of individual LEDs 60. As shown in FIG. 8b, the LED dies 13 are integrally encapsulated by a light penetrable material 40 which encapsulates all of the LED dies 13 therein simultaneously, such that the LED dies 13 are integrally packaged in the light penetrable material 40. In FIG. 8a and FIG. 8b, the substrate 11 is also packaged in the light penetrable material 30, 40. As shown in FIG. 8c, the substrate 11 is removed away and then the LED dies 13 are individually encapsulated by a light penetrable material 50. Also, the LED dies 13 in FIG. 8c can also be integrally encapsulated a light penetrable material. The above light penetrable material 30, 40, 50 may be polymethylmethacrylate (PMMA).

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing an LED, comprising:
    preparing an LED wafer comprising a substrate and an epitaxial layer formed on the substrate;
    cutting the epitaxial layer of the LED wafer into a plurality of LED dies, wherein a gap is defined between every two neighboring dies, and each of the LED dies includes a top surface and an opposite bottom surface attached to the substrate;
    filling an electrically insulating material in each gap between neighboring LED dies such that the neighboring LED dies are separated from each other by the electrically insulating material;
    providing a circuit board having a layer of electrically conductive adhesive coated thereon, wherein electrically conductive particles are dispersed in the adhesive;
    pressing the LED dies against the adhesive to bring the top surfaces of the LED dies into contact with the adhesive such that the LED dies each are electrically connected to the circuit board via some of the electrically conductive particles of the adhesive, in which the electrically insulating material is inserted into the adhesive; and
    encapsulating the LED dies with a light penetrable material.

2. The method of claim 1, wherein the insulating material has a height greater than a height of each of the LED dies, and the insulating material abuts against the circuit board.

3. The method of claim 1, wherein the adhesive is an anisotropic conductive adhesive.

4. The method of claim 1, wherein the LED dies are individually encapsulated by the light penetrable material one by one.

5. The method of claim 1, wherein the LED dies are integrally encapsulated by the light penetrable material which encapsulates all of the LED dies therein simultaneously.

6. The method of claim 1, wherein the substrate is also packaged in the light penetrable material.

7. The method of claim 1, wherein the substrate is removed away before the LED dies are encapsulated by the light penetrable material.

8. The method of claim 1, wherein two tin balls are formed on the top surface of each of the LED dies.

9. The method of claim 1, wherein the substrate is a sapphire substrate.

* * * * *